United States Patent [19]

Solie

[11] 3,833,867

[45] Sept. 3, 1974

[54] ACOUSTIC SURFACE WAVE CONVOLVER WITH BIDIRECTIONAL AMPLIFICATION

[75] Inventor: Leland P. Solie, Acton, Mass.

[73] Assignee: Sperry Rand Corporation, New York, N.Y.

[22] Filed: Oct. 23, 1973

[21] Appl. No.: 408,694

[52] U.S. Cl. ................ 333/30 R, 235/181, 310/9.8, 330/5.5, 333/72

[51] Int. Cl. ....... H03h 9/26, H01v 7/00, H03f 13/00

[58] Field of Search .............. 333/30 R, 72; 310/8.1, 310/9.8; 330/5.5; 321/60, 69 NL; 235/181

[56] References Cited

UNITED STATES PATENTS 3,770,949 11/1973 Whitehouse et al. ......... 333/30 R X

*Primary Examiner*—James W. Lawrence
*Assistant Examiner*—Marvin Nussbaum
*Attorney, Agent, or Firm*—Howard P. Terry

[57] ABSTRACT

Apparatus for the convolution of two input signals introduced at opposite ends of an acoustic surface wave propagation medium provides amplification of the two oppositely propagating signals and their integration in an intermediate semiconductor film cooperating with a contiguously overlying electrode pattern serving both as the signal output transducer and for coupling unidirectional electrical bias fields for amplifying the convolved output.

10 Claims, 3 Drawing Figures

ACOUSTIC SURFACE WAVE CONVOLVER WITH BIDIRECTIONAL AMPLIFICATION

1. Field of the Invention

The invention relates to the art of signal convolver devices for generating a convolved output signal from a pair of predetermined input signals. More particularly, the invention pertains to acoustic surface wave apparatus having unitary means for amplifying the energy in oppositely flowing input signals and for generating a useful electrical output representing the convolution of the two input signals.

2. Description of the Prior Art

As will be extensively discussed in the specification, certain elements exist in the prior art which may find application in the novel apparatus for convolving two input signals, including various acoustic surface wave launching and propagation elements whereby pairs of signals to be processed may be set up as propagating waves at the surface of a layer of piezoelectric material. Convolvers have been attempted in which the output signal is generated by the weak elastic interactions of two input signals at the piezoelectric material surface. Other signal mixing and convolving arrangements have been tried, but attenuation of the input signals propagating in the media is strong enough to suggest that a superior approach is needed. The problem unsolved by the prior art is that of supplying electric biasing fields for the drifting of charge carriers without interference with the function and location of an output system for efficiently abstracting the convolved signal.

SUMMARY OF THE INVENTION

The invention is an acousto-electronic device for the convolution of two input signals introduced at opposite ends of an acoustic surface wave propagation medium having piezoelectric properties. The novel device provides amplification of the oppositely propagating signal energy and signal integration in semiconductor material at the acoustic surface and cooperating with a contiguously overlying interdigital electrode pattern serving both as the signal output transducer and for coupling unidirectional electrical bias fields within the semiconductor medium for providing amplification of the two counter-traveling input surface waves.

DESCRIPTION OF THE PREFERRED EMBODIMENTS

Figure 1:
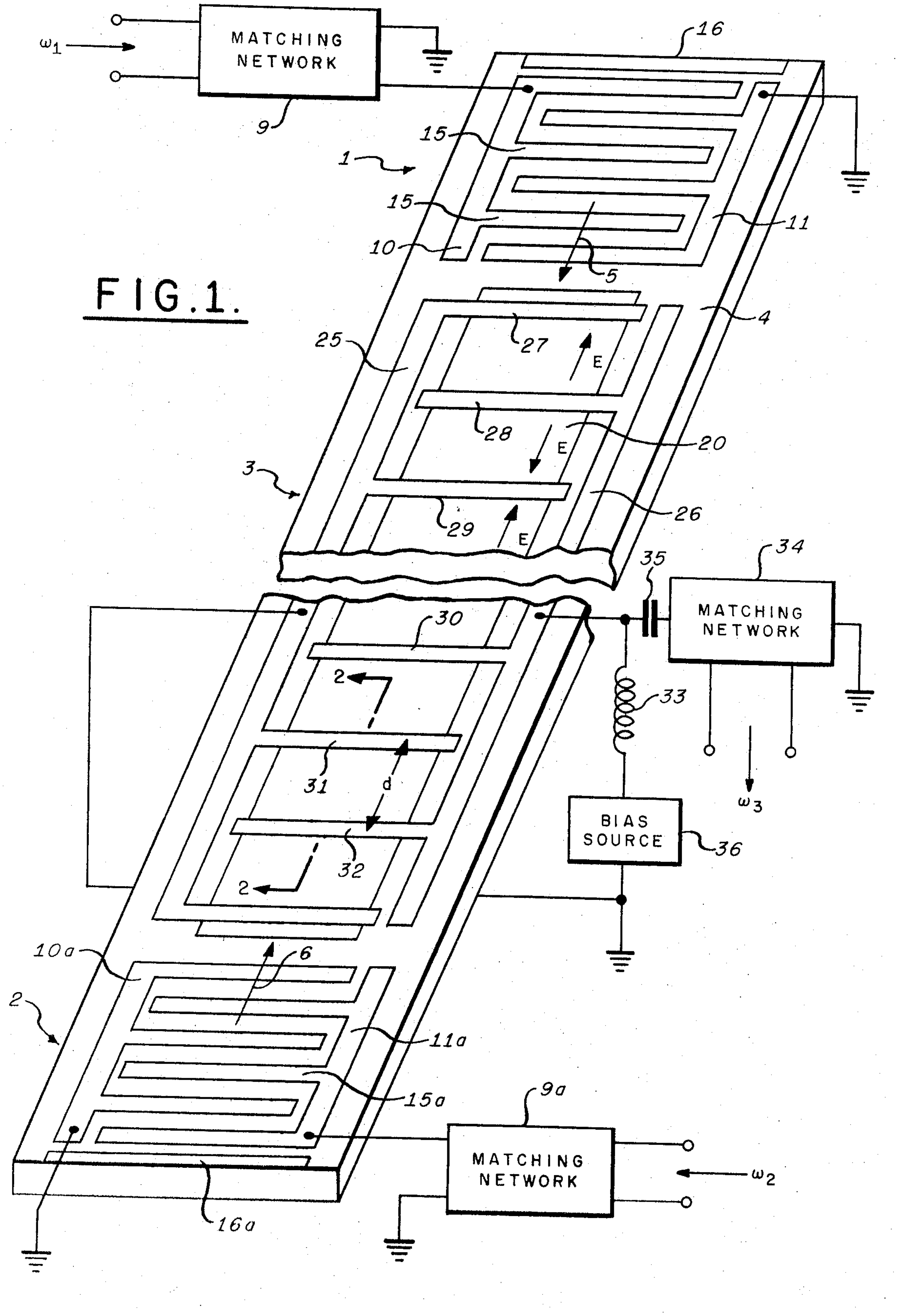
FIG. 1 is a perspective view of one embodiment of the invention.

Apparatus for the convolution of two signals in real time has long been recognized as a useful tool for processing optical, electrical, acoustic, and other signals in applications that have been described, for instance, by N. F. Barber in *Experimental Correlograms and Fourier Transforms* (1961) Pergamon Press (New York), which is Volume 5 of the *International Tracts in Computer Science and Technology and Their Application.* The convolution and correlation of two time functions f (t) and g (t) are operations which are respectively defined as:

$$\int_{-\infty}^{+\infty} f(\tau) g\left[\pm(t-\tau)\right] d\tau$$

Either operation may be defined as a process in which the functions $f(t)$ and $g(t)$ are first translated with respect to one another by a specified time $t$, with one function being inverted during convolution. Next, the product of the translated functions is generated. Finally, the resultant product is integrated. In general, convolution is a mathematical operation with respect to functions $f(u)$ and $g(u)$, since the variable is not necessarily time:

$$[f(u), g(u)] = \int_{-\infty}^{+\infty} f(u) g(u-v) du \qquad (2)$$

This general definition calls for translating $g(u)$ a distance $v$ along an arbitrary $u$ axis, multiplying $f(u)$ by the translated $g(u)$, and integration or addition of the resultant product.

In the recent prior art, there have evolved convolver concepts of some interest where the signals to be processed may be converted into acoustic surface waves. Surface acoustic waves are generated adjacent the ends of one surface of a slab of piezoelectric material by individual surface wave transducers and are launched by the latter so that the waves travel toward each other along a common surface path. Assuming two such waves having respective frequencies $\omega_1$ and $\omega_2$, or wave numbers $k_1$ and $k_2$, the waves ultimately translate in opposite directions through a common region in which a weak but finite non-linear acoustic interaction or signal mixing event occurs. By selection of a piezoelectric material such as $LiNbO_3$, for example, or other similar materials which demonstrate nonlinear elastic properties at strains corresponding to moderate power level surface waves, sum and difference signals are generated by the non-linear interaction. For example, a consequence may be that a signal of frequency $\omega_3 = \omega_1 + \omega_2$ with a wave number $k_3 = k_1 - k_2$ is generated. If $\omega_1 = \omega_2$, for example, then $\omega_3 = 2\ \omega$, and:

$$k_3 = (\omega_1/v) - (\omega_2/v) = 0$$

The electric field of the output frequency $\omega_3$ may be detected by electrically coupling proper means, such as a cavity resonator, or even a capacitive plate, at the interaction region. In the general case, $\omega_1 \neq \omega_2$ and the output may be coupled out of the propagation system by an interdigital electrode array having a periodicity corresponding to $k_3 = k_1 - k_2$ and that may otherwise be generally similar in principle and structure to the input interdigital surface wave transducer arrays.

In an effort to overcome the consequence of the weak elastic wave interaction in the foregoing devices, research efforts have turned toward configurations using a semiconductor layer either contacting or slightly separated from the piezoelectric material at the interaction region so that the electric fields of the $\omega_1$ and $\omega_2$ waves are coupled into the body of the semiconductor material. In this general category, structures demonstrating some degree of success have been made by depositing a semiconducting film, such as CdSe or CdS over a piezoelectric substrate, such as $LiNbO_3$, or by the generally inverse process of depositing a ZnO film on a Si substrate. Others have made the two material layers inherently self-supporting and have spaced them apart by a small gap with the propagating electric fields being coupled across the gap into the semiconductor material.

Where such a semiconductor layer is employed, the electric fields associated with the two oppositely propagating surface acoustic waves $\omega_1$ and $\omega_2$ produce electric current flow in the semiconductor layer. It is the inherent non-linear current-voltage characteristics of the semiconductor material that are significant, since those characteristics are now used to replace the elastic interaction mechanism for generating the desired product or convolution signal of frequency $\omega_3$. This non-linear interaction is relatively strong; however, the same mechanism that provides the interaction for the mixing of the two surface waves (the interaction of the piezoelectric fields with the charge carriers) also couples energy out of the input surface waves with the consequence that they are seriously attenuated. In turn, the input surface waves die out quickly and the useful length of the non-linear interaction region is accordingly disadvantageously short. This, in turn, seriously limits the allowed time duration of the input signals $\omega_1$ and 107 $_2$.

Figure 2:
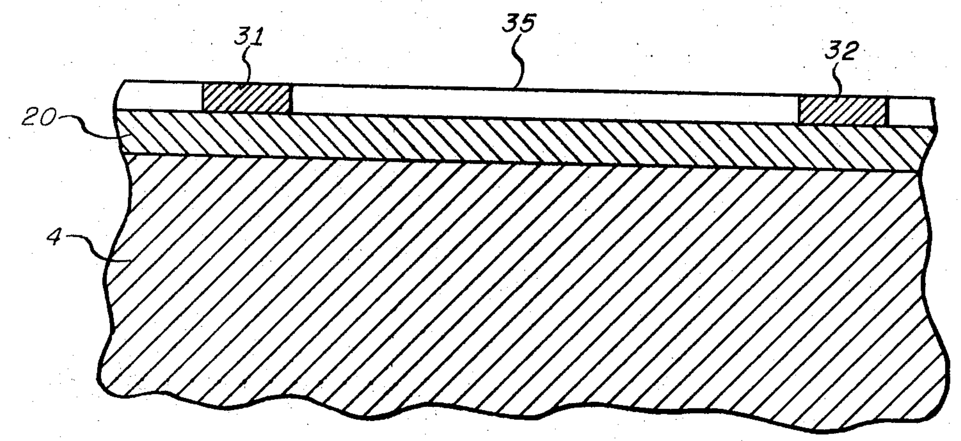
FIG. 2 is a cross section view taken along the line 2—2 of FIG. 1 of a portion of the FIG. 1 embodiment.

FIGS. 1 and 2 represent one form which the present invention may take. In FIG. 1, it is observed that the unitary structure includes three primary functional sections 1, 2, and 3, each having a particular function to perform. The sections 1, 2, and 3 are placed upon a common piezoelectric substrate 4 in the form of an elongate slab. Preferably, substrate 4 is made of Y-cut $LiNbO_3$, though kindred materials may be employed. At each end of the device, the sections 1 and 2 are provided, each of these performing the function of launching a particular surface acoustic wave at a broad surface of the piezoelectric slab 4. For example, the launching device of section 1 generates an acoustic surface wave which propagates toward the intermediate section 3 in the sense of arrow 5. Similarly, section 2 of the device has a launching device for generating and propagating a surface acoustic wave flowing in the direction indicated by arrow 6 towards section 3. The launching device of section 1 receives input signals of frequency $\omega_1$ through a conventional matching network 9, one side of the launching array being grounded. In a similar manner, the launching array of section 2 receives input signals of frequency $\omega_2$ through the conventional matching network 9*a*.

The launching transducers of sections 1 and 2 are similar devices which have been successfully demonstrated for general application in acoustic surface wave delay devices. Accordingly, the structure and operation of one of the planar interdigital transmission line devices will be described, it being understood that the second device is constructed and operates in a similar manner. It will also be understood that several types of similar surface wave launching devices are available in the prior art which may be found suitable for use in the invention.

In the form of the wave launching device shown in section 1 of FIG. 1, it is seen that the device consists of a pair of very thin film electrodes 10 and 11 with a cooperating array of respective interdigital fingers, one set of fingers being at ground potential and the other set of fingers varying in potential with respect to ground according to the signal $\omega_1$. Standard photoetching and photoresist masking or other techniques may be used to fabricate the associated very thin conductors of the interdigital electrodes 10 and 11, which electrodes may be made of gold or aluminum or other electrically conducting material. Adjacent fingers of any one electrode system, such as fingers 15 of electrode 10, are spaced one wave length apart at the operating frequency $\omega_1$. The electrode system 10, 11 behaves as an end-fire antenna array, propagating the desired forward surface acoustic wave in the direction indicated by arrow 5 when driven by electrical signals passed through matching network 9. Where generation of an undesired wave traveling in the direction opposite to arrow 5 may not be tolerated, this undesired wave may readily be absorbed in a conventional acoustically matched absorber 16. The absorber 16 may be constructed of a very thin film of a suitable acoustical absorbing material, such as wax or rubber, or certain dielectric tape materials.

In a similar manner, the array of section 2 consists of electrodes 10a and 11a along with a similar array of interdigital electrode fingers including electrode fingers such as electrode finger 15*a*. It is seen that the surface acoustic wave of section 2 is launched in the direction 6 opposite that of the wave associated with arrow 5 and has a frequency $\omega_2$ if a signal of that frequency $\omega_2$ is applied to it through matching network 9a. Absorber 16a eliminates any wave flowing opposite to the wave associated with arrow 6. In operation, electrode arrays 10, 11, and 10*a*, 11*a* produce traveling acoustic and electric fields of frequencies $\omega_1$ and $\omega_2$ at the surface of substrate 4 and thus produce the two sets of desired oppositely running acoustic and electric waves flowing as indicated by arrows 5 and 6 at right angles to the fingers of the arrays. Operation of the arrays depends in part upon the fact that each acoustic traveling wave is successively amplified as it passes under each successive pair of electrode fingers. In both instances, it is preferred in the interest of efficiency to space the electrode fingers of the two input arrays so that conditions of acoustic synchronism obtain for each, the traveling wave fields represented by arrows 5 and 6 having the same periodicity as the electric field normally bound to the acoustic wave.

The interaction or amplifier-convolver region 3 involves a structure illustrated in FIGS. 1 and 2 extending substantially throughout the region between sections 1 and 2 of the apparatus as a very thin film 20 of semiconducting material. While CdSe is preferred, CdS or other related semiconductor materials may be employed; the film may be applied to the acoustic wave surface by any of several conventional techniques, including vacuum deposition, after which it is annealed. Residing on top of the semiconductor film 20 is a third interdigital electric wave propagation structure including the interdigital transmission line elements 25 and 26, each of which are also supplied with a regularly spaced interdigital array of electrode fingers, such as fingers 27 through 32. The transmission line system 25, 26 and its associated interdigital fingers are formed for convenience partly at the surface of the piezoelectric material of slab 4 and partly on the thin semiconductor film 20 so that they may readily be fabricated by methods similar to those used in making the arrays 10, 11 and 10*a*, 11*a*. The semiconducting film 20 may have a resistivity of about $2 \times 10^4$ to $7 \times 10^{10}$ ohms per square. The semiconducting film resistivity is controlled by standard doping procedures or, if the semiconducting film is photoconductive, by controlling the amount of light illuminating it.

The non-linear current-voltage characteristics of the semiconductor film 20 are employed, according to the invention, for generating signals of frequency $\omega_3$ as discussed in the foregoing. The surface wave at frequency $\omega_2$ associated with arrow 6 propagates through section 3 of the apparatus, while the surface wave at frequency $\omega_1$ associated with arrow 5 propagates in the same acoustic path, but in the opposite direction. In the region within section 3 in which these two surface waves overlap, they generate signals at the sum and difference frequencies. Of particular interest is the sum frequency $\omega_3 = \omega_1 + \omega_2$. This signal is generated with a phase variation corresponding to $k_3 = k_1 - k_2$. The periodicity of the metallic structure in section 3 is therefore set to detect the signal with this wave number, i.e., $2\pi/k_3 = \lambda_3 = 2d$ where $d$ is the center-to-center spacing of the interdigital structure in section 3. Each pair of electrodes 30, 31, 32 in section 3 may be regarded as a tap which detects the signal at frequency $\omega_3$, but since all the taps are connected electrically in parallel, the contributions from the various taps are added. This addition is the integration which completes the convolution process. Thus, the non-linear current-voltage mixing mechanism provides the product signal locally within structure 3, and the interdigital electrode structure takes the integral of this product to yield the desired convolution signal.

A key feature of the invention lies in the fact that it can also amplify both of the counter-traveling surface waves if a bias field from source 36 is applied across the interdigital electrode pattern in section 3. As a result, the two surface waves do not attenuate while they propagate through the interaction region 3, and thus the time duration of the pulses to be convolved is not limited by their decay length in the interaction region. The bias voltage also increases the nonlinearity of the voltage-current characteristics, which further enhances the level of the convolution signal. The electrical bias 32 is a direct or pulses current which is coupled through the inductance 33 to electrode 26.

Thus, a substantial unidirectional bias or pulsed voltage is applied between adjacent electrode fingers, such as fingers 27, 28, and 29. It will be recognized that the consequent unidirectional electric bias fields alternate in direction, as indicated by the arrows marked E between the respective fingers 27, 28, and 29. After amplification of the signals, the $\omega_3$ energy is passed to an output matching network 34 from which the desired convoluted signal $\omega_3$ is derived for application to utilization equipment. So that direct current or other undesired signals from source 32 do not flow into the matching network 34 and thus into the output of the system, an isolating element such as capacitor 37 is interposed between inductor 33 and matching network 34.

In a further embodiment of the invention, a single layer of active material replaces the piezoelectric layer 4 and the semiconductor layer 20 of FIGS. 1 and 2, the two layers being replaced with a material which displays both piezoelectric and semiconductive properties. For example, a single propagation layer of CdS, GaAs, or other material that is both piezoelectric and semiconducting may be used, a necessary condition still being that the electric field associated with the acoustic waves in the piezoelectric medium interact with the carriers of the semiconducting medium. It is seen that the conductive electrodes in section 3 are in direct electrical connection with the semiconductor material and are at least capacity coupled to the piezoelectric material, as in the embodiment of FIGS. 1 and 2. It will therefore be understood that the active surface layer means of the invention may comprise contiguous or spaced layers that are respectively semiconductive and piezoelectric, or an active surface layer of a material having both semiconductive and piezoelectric properties.

Figure 3:
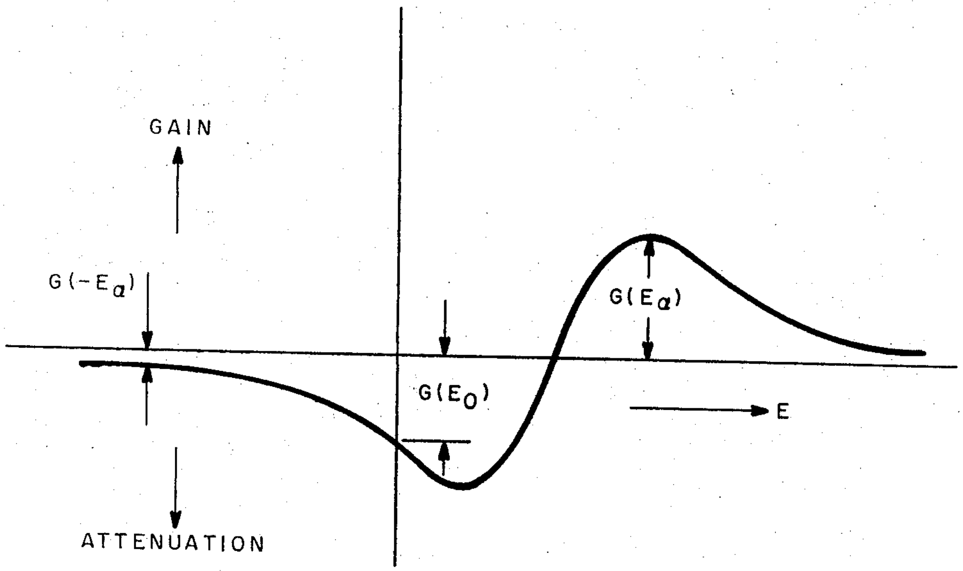
FIG. 3 is a graph useful in explaining operation of the invention.

In both embodiments, the novel surface wave amplifier elements of section 3 require charge carriers such as are normally present in the photoconductive or other semiconductor material of film 20 to exist in the presence of the traveling electric field bound to the surface acoustic wave. An appropriate biasing electric field field E tends to accelerate the charge carriers in the same direction as the direction of propagation of the surface acoustic wave. Consider for the moment the operation of the convolver device with respect only to the wave of arrow 5; then, a qualitative view of the surface wave gain in section 2 is represented in FIG. 3 as a function of unidirectional electric field E. If there is no unidirectional bias field applied by source 36, the surface wave will be severely attenuated as at G ($E_o$). Maximum gain G ($E_a$) is achieved for a bias electric field directed so that the charge carriers drift in the same direction as the surface wave propagation. If, now, the bias field E is reversed relative to the direction of propagation of the surface wave, only a small attenuation $G(-E_a)$ is suffered. It is to be observed that $G|(-E_a)| << |G(E_a)|$. Thus, a structure such as that of FIG. 1 with equal distances between successive forward and back biased electrode fingers 27, 28, and 28, 29 and with the unidirectional fields thereacross also equal will amplify equally well in both directions, a feature not available in prior art devices. The problem unsolved in the prior art of supplying the required electric biasing fields without interference with the design and operation of the $\omega_3$ output system is also solved. In the invention, both problems are simultaneously solved by having all of the gaps such as those between electrode fingers 27, 28 and 28, 29 equal in length and by operating the bias electrodes as integral parts of the output transmission line or transducer system itself.

It will be understood in FIG. 1 that the conductive films of electrode systems 10 and 11, 10*a* and 11*a*, and 25 and 26, and of the semiconductor film 20 are shown because of the scale of the drawing as having no perceptible thickness, though these dimenisons are indeed finite. It will further be understood that the view in FIG. 2 shows conductive electrode elements 31, 32, and 35 and the semiconductor film 20 on a different scale so that they clearly have finite thicknesses. Both drawings are proportioned for convenience in illustrating the structure of the invention and neither necessarily represent dimensions or proportions which would be employed in actual practice.

One successful structure, for example, employed input transducers operating respectively at 123 and 132 MH for producing a sum output frequency of 255 MHz. The central amplifier-convolver section 3 has a length of about 1.5 centimeters and uses an electrode structure of 45 electrode fingers interdigitally spaced with respect to 44 opposed fingers. With moderate illumination from an electric light, and with appropriate unidirectional bias voltage between transmission line elements 25, 26, an electronic gain corresponding to a 6dB per centimeter was achieved. It will be understood that obtaining an actual net gain in this device would not be desirable. Net gain, together with the bidirectional nature of the device, would make its operation unstable because reflections would be amplified and would therefore build in amplitude, causing the device to oscillate. The amplification is provided so as to decrease the large attenuation of the device (75 d B per centimeter) to a reasonable value for operation as a convolver.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. Signal convolver apparatus comprising:

a body having first and second ends and active surface layer means adapted for propagating acoustic surface waves, first launcher means for launching a first acoustic wave adjacent said first end at said active surface layer means toward said second end, second launcher means for launching a second acoustic surface wave adjacent said second end at said active surface layer means toward said first end, said active surface layer means having cooperative semiconductive and piezoelectric properties in a region extending at least substantially between said first and second launcher means, conductive array means on said active surface layer means at said region including regularly spaced electrode finger means for supporting cyclically alternating unidirectional bias electric fields of substantially equal magnitudes between successive pairs of said electrode finger means for causing amplification of said first and second acoustic surface waves, and transducer means for coupling from said conductive array means a sum frequency signal having a frequency equal to the sum of the frequencies of said first and second acoustic surface waves.

2. Apparatus as described in claim 1 wherein said active surface layer means in said region comprises mixer means for forming said sum frequency.

3. Apparatus as described in claim 2 wherein said body comprises a piezoelectric material.

4. Apparatus as described in claim 2 wherein said first and second launcher means comprises first and second planar interdigital transmission line input means.

5. Apparatus as described in claim 3 wherein said body comprises $LiNbO_3$.

6. Apparatus as described in claim 2 wherein said body comprises a piezoelectric semiconductive material.

7. Apparatus as described in claim 1 wherein said active surface layer means comprises a thin film of a semiconductor material deposited on a piezoelectric material surface.

8. Apparatus as described in claim 2 wherein:

said transducer means comprises first and second substantially parallel conductor means, said first conductor means is coupled to alternate ones of said electrode finger means, and said second conductor means is coupled to the remainder ones of said electrode finger means.

9. Apparatus as described in claim 8 including:

bias source means coupled through inductive means across said first and second parallel conductor means.

10. Apparatus as described in claim 9 including:

blocking capacitor means coupled between output matching network means for said sum frequency signal and the junction between said transducer means and said inductive means.

* * * * *